(12) United States Patent
Becker et al.

(10) Patent No.: US 11,871,115 B2
(45) Date of Patent: Jan. 9, 2024

(54) COLOR NIGHT VISION THROUGH THE SPATIAL FILTERING OF TOLED TECHNOLOGY

(71) Applicant: L3Harris Technologies, Inc., Melbourne, FL (US)

(72) Inventors: Jacob J. Becker, Gilbert, AZ (US); Jon D. Burnsed, Tempe, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 81 days.

(21) Appl. No.: 17/498,998

(22) Filed: Oct. 12, 2021

(65) Prior Publication Data

US 2023/0110707 A1 Apr. 13, 2023

(51) Int. Cl.
*H04N 5/238* (2006.01)
*G02B 23/12* (2006.01)
*H04N 23/71* (2023.01)
*G02B 27/01* (2006.01)
*H04N 23/56* (2023.01)
*H04N 23/57* (2023.01)
*H04N 23/75* (2023.01)
*H10K 59/60* (2023.01)

(52) U.S. Cl.
CPC ......... *H04N 23/71* (2023.01); *G02B 27/0101* (2013.01); *H04N 23/56* (2023.01); *H04N 23/57* (2023.01); *H04N 23/75* (2023.01); *H10K 59/60* (2023.02); *G02B 23/12* (2013.01)

(58) Field of Classification Search
CPC ..... H01L 27/3227; G03B 23/12; H04N 5/238
USPC ...................... 359/333; 348/207.99
See application file for complete search history.

(56) References Cited

U.S. PATENT DOCUMENTS 8,830,204 B2    9/2014 Sultenfuss et al.
9,503,623 B2 *  11/2016 Keesling ................ H04N 5/357
11,120,534 B2 * 9/2021 Vollmerhausen ......... G06T 5/50
(Continued)

FOREIGN PATENT DOCUMENTS

WO    2007049213    5/2007

OTHER PUBLICATIONS

U.S. Appl. No. 16/868,306, filed May 6, 2020.
European Search Report received for EP Patent Application No. 22200991.2, dated Feb. 17, 2023, 6 pages.

*Primary Examiner* — Anthony J Daniels
(74) *Attorney, Agent, or Firm* — Workman Nydegger

(57) ABSTRACT

An optical device includes an underlying device configured to output light in a first spectrum. A stacked device is coupled to the underlying device and configured to be coupled in overlapping fashion to an optical output of the underlying device. The stacked device is transparent to light in the first spectrum. The stacked device includes electro-optical circuits including: light emitters and detectors. Each detector is associated with one or more light emitters. Each detector is configured to detect light emitted from the underlying device. The light emitters are configured to output light dependent on light detected by an associated detector. Optical filters are optically coupled to an optical input of the underlying device. Each filter is aligned with a detector to suppress absorption of certain wavelengths of light by the underlying device thereby affecting light detected by the detectors and thus further affecting the light output by the light emitters.

20 Claims, 6 Drawing Sheets

(56) References Cited

U.S. PATENT DOCUMENTS

| | | | |
|---|---|---|---|
| 2002/0175268 A1* | 11/2002 | Smith | G02B 23/12 |
| | | | 250/208.1 |
| 2004/0036013 A1 | 2/2004 | Bacarella et al. | |
| 2004/0196566 A1 | 10/2004 | Beystrum et al. | |
| 2008/0157000 A1* | 7/2008 | Shamir | G02B 23/12 |
| | | | 250/474.1 |
| 2015/0008390 A1* | 1/2015 | Lewis | H01L 27/3227 |
| | | | 438/24 |
| 2017/0094199 A1* | 3/2017 | Sarusi | H01L 27/3234 |
| 2019/0098264 A1* | 3/2019 | Ludwig | H04N 5/2254 |
| 2019/0393271 A1* | 12/2019 | So | H01L 51/42 |
| 2020/0400944 A1* | 12/2020 | Burnsed | H04N 5/2258 |

\* cited by examiner

COLOR NIGHT VISION THROUGH THE SPATIAL FILTERING OF TOLED TECHNOLOGY

BACKGROUND

Background and Relevant Art

Night vision systems allow a user to see in low-light environments without external human visible illumination. This allows for covert vision in a low-light environment to prevent flooding the environment with human visible light and/or protects the user from being detected due to causing human visible light or light that is otherwise detectable to other night vision systems to be emitted.

Some night vision systems function by receiving low levels of light reflected off of, or emitted from objects and providing that light to an image intensifier (sometimes referred to as $I^2$). The image intensifier has a photocathode. When photons strike the photocathode, electrons are emitted into a vacuum tube, and directed towards a microchannel plate to amplify the electrons. The amplified electrons strike a phosphor screen. The phosphor screen is typically chosen such that it emits human visible light when the amplified electrons strike the phosphor screen. The phosphor screen light emission is coupled, typically through an inverting fiber-optic, to an eyepiece where the user can directly view the illuminated phosphor screen, thus allowing the user to see the objects.

Night vision systems that rely on image intensifier tubes use phosphor screens to emit visible light recreating the night vision scene for the user. Because these systems convert scene light into electrons within the vacuum tube before converting back to visible light, all color information is lost. Color information is important to distinguish between surfaces that have similar average reflectance values that may otherwise appear at the same brightness within a nightvision system. This is in addition to the benefits of identifying blood, uniform colors, vegetation, bodies of water, or vehicle coloring, or other color relevant information. Current tube-based nightvision systems simply do not have this capability.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes an optical device. The optical device includes an underlying device configured output light in a first spectrum as a result of absorbing input light. A stacked device is coupled to the underlying device. The stacked device is formed in a single semiconductor chip and is configured to be coupled in an overlapping fashion to an optical output of the underlying device. The stacked device is transparent, according to a particular transmission efficiency, to light in the first spectrum. The stacked device includes a plurality of electro-optical circuits formed on the semiconductor chip, including: a plurality of light emitters configured to output at least one color of light and a plurality of detectors. Each detector is associated with one or more light emitters in the plurality of light emitters. Each detector is configured to detect light emitted from the underlying device. The light emitters are configured to output light dependent on light detected by an associated detector. The optical device further includes a plurality of optical filters optically coupled to an optical input of the underlying device. Each filter in the plurality of optical filters is aligned with a detector from among the plurality of detectors to suppress absorption of certain wavelengths of light by the underlying device thereby affecting light detected by the detectors and thus further affecting the light output by the light emitters.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Recent advances in night vison technology have allowed for simultaneous display of digital information overlaid on direct-view image intensifier images. In particular, transparent and/or semi-transparent digital display chips can be placed at the output of the image intensifiers such that light from the image intensifiers passes through the digital display chips, while the digital display chips simultaneous display digital information to a user. These digital chips may further include detector circuits to detect light from the image intensifier, or other sources.

Embodiments illustrated herein can add spatial color filters to the input focal plane that are aligned (or at least in the same optical path) with detectors on the output side of an image intensifier. In some embodiments, the filters can be 'notch' filters that filter all colors except for a specific color band. In this way, input light is filtered by the filters. Any light remaining after passing through a given filter can be assumed to be within the unfiltered color band. In this way, color information can be preserved in seemingly monochrome image intensifier output.

Note that in other embodiments, different specific colors can be filtered and corresponding detectors that are proximate each other can be used to identify color information. That is, different colors of filters can be used and paired with detectors such that detector output from multiple proximate detectors can be used to reconstruct a color image from the image intensifier output.

Thus, software controls can convert a seemingly monochrome image output from the phosphor screen of an image intensifier into a full color image for display using a combination of light emitters in transparent digital display chips and light transmitted from the image intensifier output through the transparent digital display chips.

Figure 1:
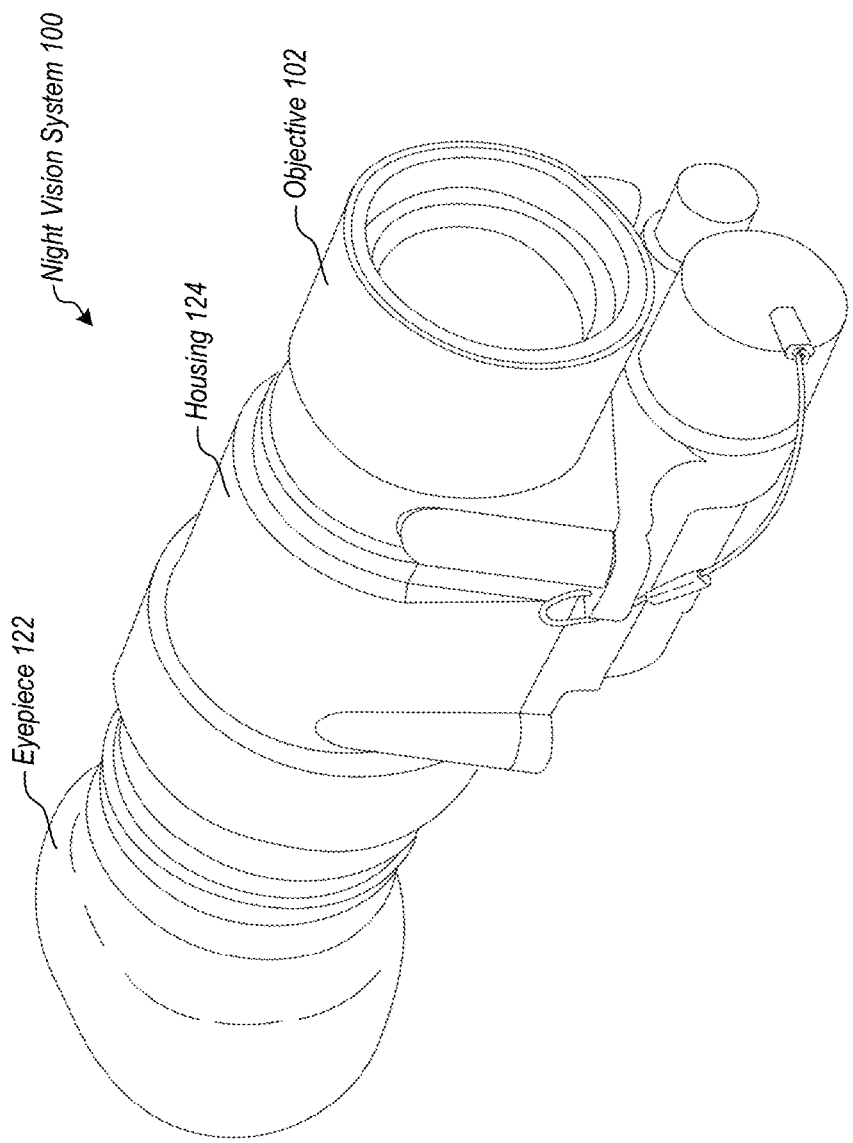
FIG. 1 illustrates a nightvision system.

Additional details are illustrated. Attention is now directed to FIG. 1, where a specific example of a nightvision system is illustrated. In particular, FIG. 1 illustrates the PVS-14 nightvision system 100. In the example illustrated, the nightvision system 100 includes a housing 124. As will be illustrated in more detail below in other figures, the housing 124 houses a fiber optic faceplate having multiple filters an image intensifier, a transparent camera having multiple detectors for detecting intensified light from the image intensifier, and various other components. The nightvision system 100 further includes an objective 102 which receives weak light reflected and/or generated in an environment. The objective 102 includes optics such as lenses, waveguides, and/or other optical components for receiving and transmitting light to an image intensifier, discussed in more detail below. The nightvision system 100 further includes an eyepiece 122. The eyepiece 122 includes optics for focusing images created by the nightvision system 100, including images created by an image intensifier and images created by a camera, into the eye of the user.

Figure 2:
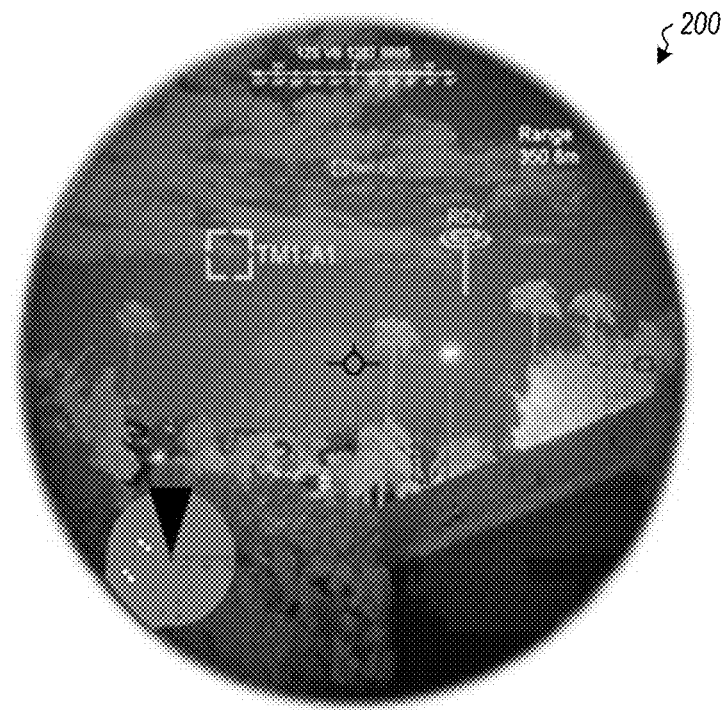
FIG. 2 illustrates a nightvision scene image with heads-up display functionality.

As discussed above, and with reference to FIG. 2, modern ancillary functionality can be added to existing nightvision systems. FIG. 2 illustrates an image 200 including a heads-up display displayed on a nightvision image output from an image intensifier. Some embodiments described herein are directed to implementing a heads-up display implemented by adding image overlay capabilities with a nightvision system, where the image overlay capabilities are able to colorize the ordinarily monochrome night vision image.

The heads-up display may display to the user, in or around the field-of-view of an environment, various pieces of information to create an augmented reality (AR) environment. Such information may include, for example, a navigational heading, the speed at which the user is moving, coordinates, communication messages (such as email, SMS, etc.), time of day or other timing information, vital signs for the user such as heart rate or respiration rate, indicators indicating whether an object being viewed by the nightvision system is friendly or adversarial, battery charge level for the nightvision system or other devices, weather conditions, contact information, audio information (such as volume, playlist information, artist, etc.), etc. In some embodiments, the heads-up display can superimpose color image data over intensified light images to colorize the images. Note also that due to psychovisual perception in humans, there is no need to fully colorize an intensified light image. Rather, some embodiments, can use color oversaturated grid lines, horizontal lines, diagonal lines, dots, or event text to create a perception of colorization for monochrome image intensifier images. An example of this technology is referred to as the color assimilation grid. In some embodiments, by using colored text, additional textual information can be provided when the user focuses their attention on the text, but when the user focuses on the image as a whole, the colored text will serve to simply colorize the image due to the psychovisual perception phenomenon discussed above.

Note that the camera (or other elements) may include photodetectors for detecting intensified light. Detecting intensified light can be used to determine the locations of various objects in the field of view. This information can be used for target indicators or other images output by the camera. Further, by knowing which detectors are correlated to which filters, color information can be deduced.

Figure 3:
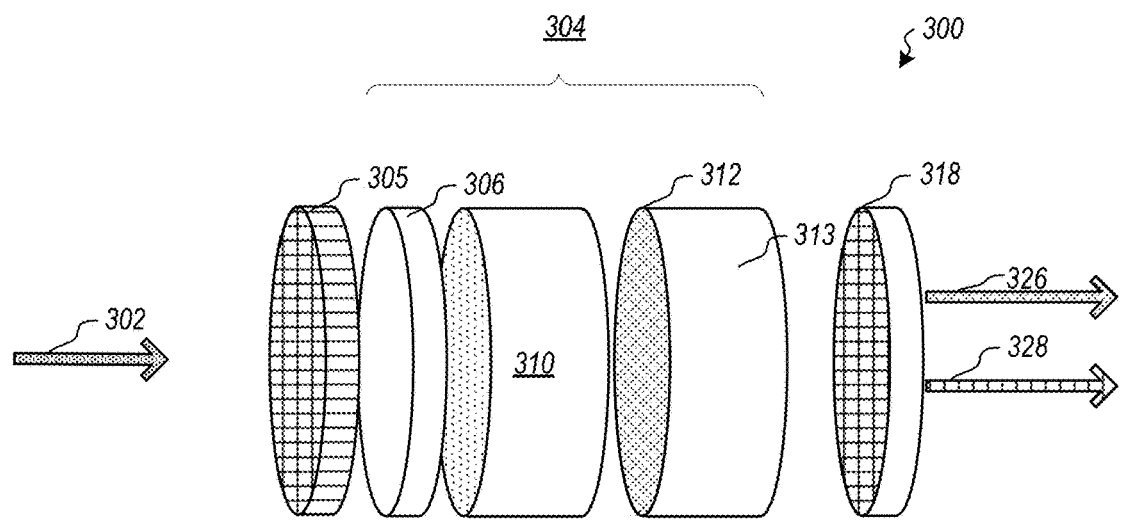
FIG. 3 illustrates a block diagram of components of a nightvision system.

Attention is now directed to FIG. 3. FIG. 3 illustrates a block diagram version of a nightvision system 300. While not shown in FIG. 3, a nightvision system typically includes an objective (such as that shown in FIG. 1 at 102) to focus input light 302 into an underlying device 304, which in this case is an image intensifier. Such input light may be, for example, from ambient sources, such as light from heavenly bodies such as stars, the moon, or even faint light from the setting sun. Additionally, or alternatively, ambient sources could include light from buildings, automobiles, or other faint sources of light that cause reflection of light from an object being viewed in a nightvision environment into the objective. A second source of light may be light being emitted from an external source towards an object, reflected off the object, and into the objective. For example, the source may be an infrared source that is not detectable in the visual spectrum for human observers. A third source of light may be light emitted by an object itself. For example, this may be related to infrared heat energy emitted by the object and directed into the objective. Nonetheless, the nightvision system is able to convert the light emitted from the source into a viewable image for the user.

Figure 5:
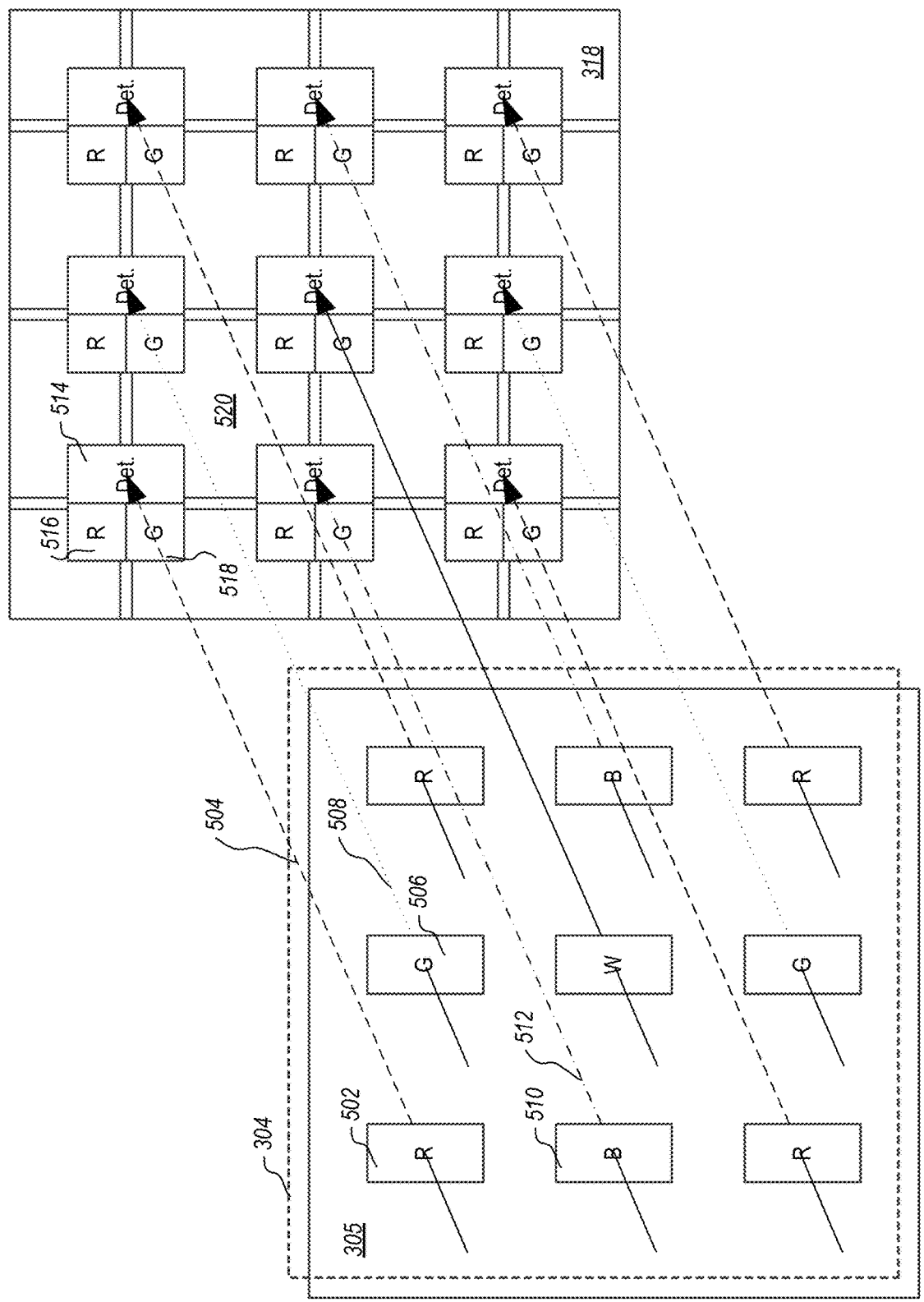
FIG. 5; illustrates perspective view of a filter arrangement

The objective directs input light 302 into the fiber optic faceplate 305. The fiber optic faceplate comprises a plurality of color filters including filters which pass different color bands. Thus, different portions of light passing through the fiber optic faceplate 305 will have different colors filtered out. An example of this is illustrated and will be discussed in more detail with respect to FIG. 5. For example, FIG. 5 illustrates input light filtered by a red filter 502 to produce filtered light that includes red light (e.g., approximately 620 nm to 750 nm). Note that in this example, the red filter 502 is configured to filter colors other than red, while allowing red light to pass through the red filter 502. This light is provided to the underlying device 304 which produces the output light 504. FIG. 5 further illustrates input light filtered by a green filter 506 to produce filtered light that includes green light (e.g., approximately 495 nm to 570 nm). The green filter 506 filters colors other than green, such that any light that passes through the green filter 506 will have green elements, while excluding other elements. This light that includes green light is provided to the underlying device 304 which produces the output light 508. FIG. 5 further illustrates input light filtered by a blue filter 510 to produce filtered light that includes blue light (e.g., approximately 450 nm to 495 nm). Thus, the blue filter 510 filters colors other than blue to produce blue light. This light that includes blue light is provided to the underlying device 304 which produces the output light 512. While a single filter of each color is discussed, it should be appreciated that multiple different filters of the various colors (including filters for infrared or ultraviolet) can be implemented. Some embodiments may implement a filter to filter out the visible light range entirely and then colorize the remaining NIR (near infrared) light as some new coloration. For example, embodiments may show the NIR to be a dark purple coloration to accentuate that the light being seen is beyond 'red' and is indeed a new 'color' being detected. Further, it should be appreciated that filters are arranged in size, number, shape, and order to facilitate color characterization of objects in an environment.

Figure 6:
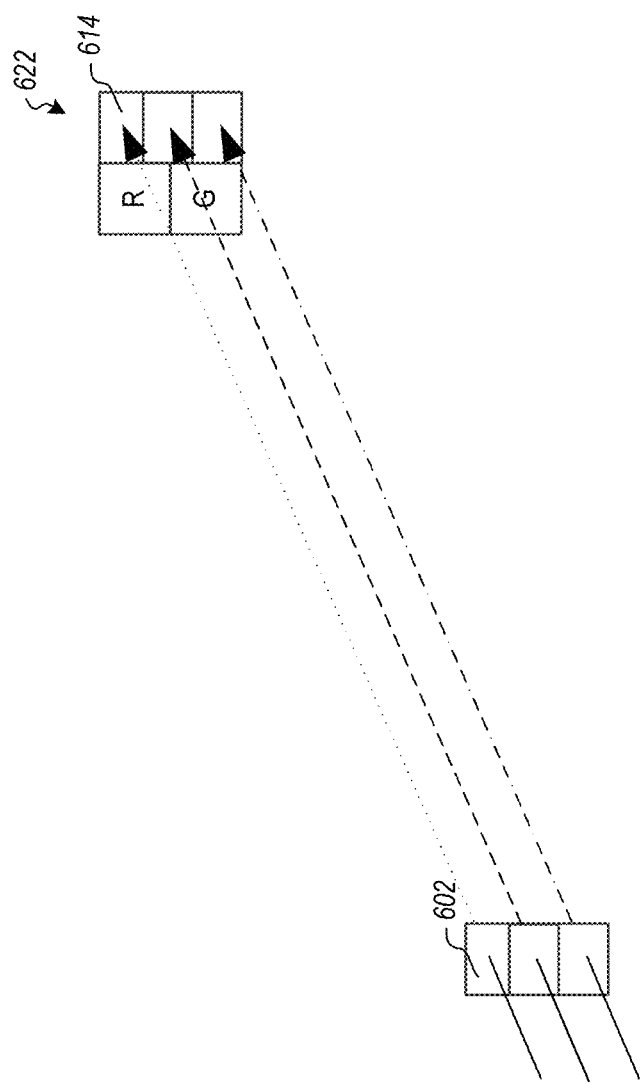
FIG. 6; illustrates perspective view of a filter arrangement having multiple filters per pixel.

For example, while the illustrated example shows a single detector per pixel, it should be appreciated that multiple detectors and corresponding differently colored filters may be implemented in a single pixel in other embodiments. Thus, for example, the detector 514 may be replaced with three different detectors and the filter 502 may be replaced with three different, differently colored, filters. An example of this is illustrated in FIG. 6, which illustrates a filter 602 which has three different sub-filters with different spectrum filtering, and a detector 614 having three sub-detectors, each corresponding to a sub-filter such that a single pixel (i.e., pixel 622) can detect multiple different colors of light.

Note that in the illustrated example, there are several areas of the input focal plane of the fiber optic faceplate 305 that do not include filters. This allows unfiltered light to be passed to the underlying device 304. Thus, returning once again to FIG. 3, unfiltered light and filtered light is passed by the fiber optic faceplate 305 to an underlying device 304. Note that the underlying device 304 may include functionality for amplifying light received from the fiber optic faceplate to create a sufficiently strong image that can be viewed by the user. This may be accomplished using various technologies such as a photocathode 306, a microchannel plate 310, and a phosphor screen 312. The photocathode 306 may be configured to generate photo electrons in response to incoming photons. Electrons from the photocathode 306 are emitted into the microchannel plate 310. Electrons are multiplied in the microchannel plate 310.

Electrons are emitted from the microchannel plate 310 to a phosphor screen 312 which glows as a result of electrons striking the phosphor screen 312. This creates an image from the filtered light based on the input light 302. Note that due to the filters in the fiber optic faceplate 305, certain portions of the image generated by the phosphor screen 312 have color data included in the apparent monochrome image. For example, if a portion of the phosphor screen coaxially aligned (or at least in the same optical path) with a red filter glows, then light received at that portion of the phosphor screen includes red components while excluding other color components.

A fiber-optic 313 carries this image as intensified light to the eyepiece (such as eyepiece 122 illustrated in FIG. 1) of a nightvision system where it can be output to the user. This fiber-optic can be twisted 180 degrees to undo the inversion caused by the system objective to allow for convenient direct viewing of the screen. However, as illustrated below, the intensified light is output to the user through a transparent camera 318. The camera 318 allows intensified light to pass through the camera 318, but also generates its own light, from LEDs or other light emitters, to transmit to a user. Creating a transparent camera may be accomplished, for example, using the teachings of U.S. patent application Ser. No. 16/868,306, filed on May 6, 2020, titled "Backside Etch Process For Transparent Silicon Oxide Technology", which is incorporated herein by reference, in its entirety.

As discussed above, the camera 318 may include functionality for displaying information to a user. Such information may include graphical content, including text, images, and the like.

In the example illustrated in FIG. 3, the camera 318 outputs display light 326 which can be sent to the eyepiece (such as the eyepiece 122 illustrated in FIG. 1). As noted previously, the intensified light 328 is also provided to the eyepiece. Thus, an image such as that illustrated in FIG. 2 is presented to the user in the nightvision system.

As noted previously, the camera 318 is composed of a number of active silicon areas. In particular, the camera 318 is a digital display having a certain pixel density. Each pixel has one or more transistors controlling one or more OLED emitters. In the embodiments illustrated herein, the pixels further include light detectors. This can be useful for detecting the intensified light from the phosphor screen 312. This detected light can be used to characterize the image intensifier image. Note that due to the filtering described earlier, when light is detected on a detector that is aligned coaxially (or at least in the same optical path) with a filter, then embodiments can determine color characteristics for that detected light.

In some embodiments, the detected light can additionally be used for recording scene events and/or improving placement of elements displayed on the heads-up display. In any case, the camera 318 is representative of a stacked device formed in a semiconductor chip that overlaps an underlying device, in this case, the underlying device is an image intensifier. The stacked device is transparent to light in a first spectrum, which in this case is the visible spectrum of light output by the phosphor screen 312. That is, the transparent camera 318 is not fully transparent due to the blocking of the active devices, but transparency referred to herein refers to at least partial transparency according to some transmission efficiency. Indeed, the more active devices implemented per pixel, the less transparent the camera 318 becomes. Thus, some embodiments are specifically implemented in a fashion designed to limit the number of active devices per pixel, such as by including only a single detector per pixel. However, other embodiments may be implemented with multiple detectors per pixel as shown in FIG. 6 and discussed previously.

Each detector absorbs a portion of the intensified light converting it to an electrical signal. For example, embodiments can implement a two-dimensional array of detectors that generate charges, current, or any other form of digital data level proportional to intensity of the intensified light as a function of position. An example of this is illustrated in FIG. 5 by the detectors shown there, of which detector 514 is representative. Accordingly, the detectors may generate a two-dimensional array of electrical charge that represents at least portions of the intensified image. This two-dimensional array of electrical charges can be periodically read from the detectors (e.g., the detected signal can be read from the detectors like in a charged coupled device (CCD) camera).

The two-dimensional array of electrical charges from the photodetector is processed and/or used locally, e.g., within the camera 318 to modulate in real time the amplitude of the display light 326 output by the camera 318. In particular, the camera 318 will output light based on the light detected by the detectors. Specifically, using the color information included in the intensified light as a result of the filters in the fiber optic faceplate 305, light from light emitters (see e.g., FIG. 5 which includes a plurality of light emitters, of which light emitters 516 and 518 are representative) in the camera 318. In particular, the camera can output light of appropriate color and intensity to "colorize" images from the underlying device 304.

As noted previously, the camera 318 includes regions that are transparent to intensified light output by the underlying device 304. For example, FIG. 5 illustrates a number of transparent regions, of which transparent region 520 is representative.

Figure 4:
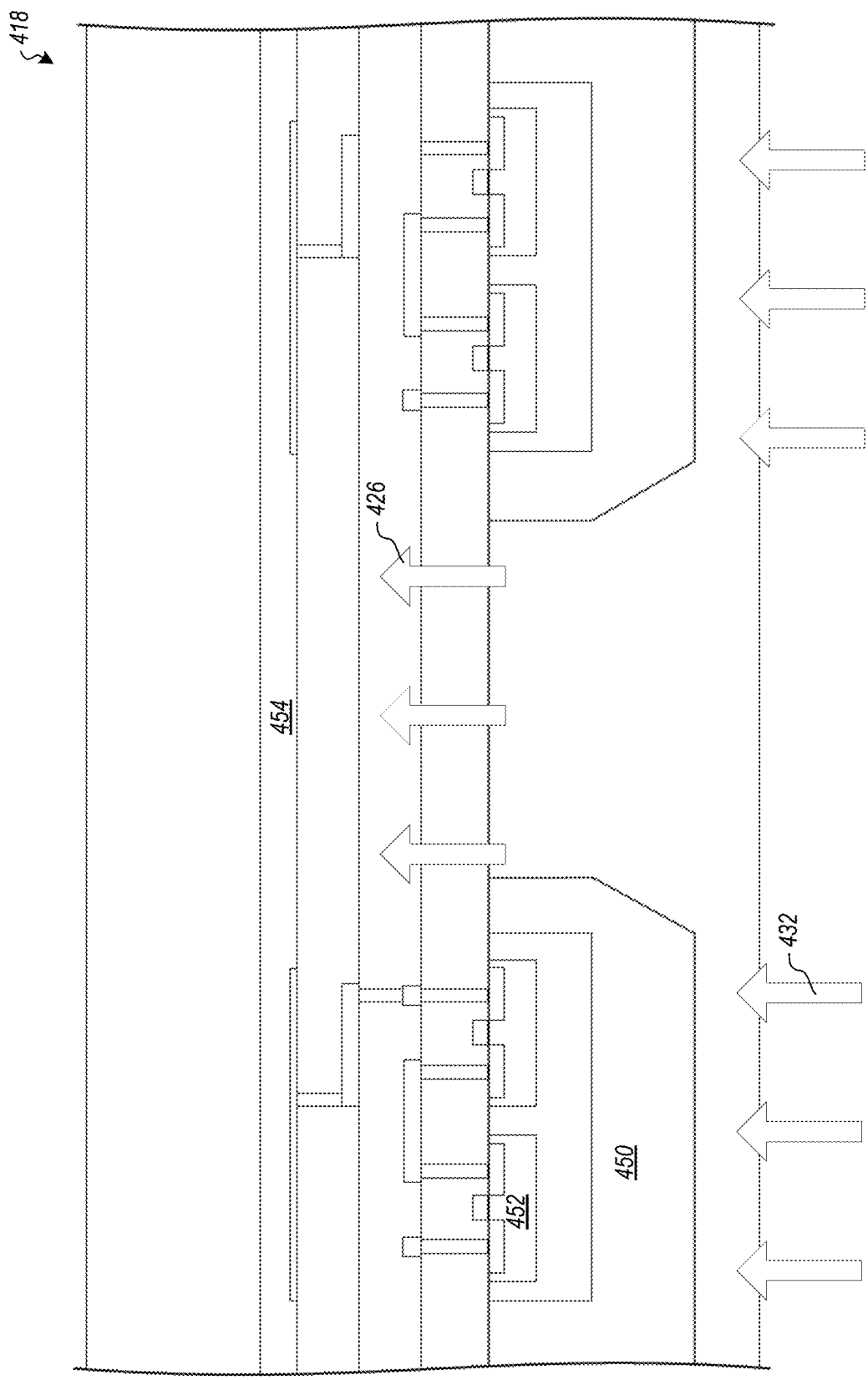
FIG. 4 illustrates a transparent display structure cross-section view, including transparent regions.

The transparent regions shown in the preceding figures can be created in a number of particular ways. In some embodiments, the transparent regions can be created by using the processes described in U.S. patent application Ser. No. 16/686,306 titled "Backside Etch Process For Transparent Silicon Oxide Technology", which is incorporated herein by reference in its entirety. Briefly, that application describes a process for creating transparent regions in otherwise opaque portions of semiconductor materials. For example, reference is now made to FIG. 4 which illustrates a camera 418 including active silicon areas shown as active silicon islands (which may be native silicon islands) such as active silicon island 450. In particular, active silicon islands include transistors such as transistor 452 which control OLED emitters in an OLED stack 454. Note, that as discussed above, transistors also control detectors, such as various photodiodes or other detectors. In the example illustrated in FIG. 4, each of the active silicon islands represents a pixel or sub-pixel of the camera 418. Thus, by illuminating various LEDs in the OLED stack 454 using the transistors in the active silicon islands, an image can be created and output to a user, such as by outputting display light such as the display lights 326 illustrated in FIG. 3.

As illustrated in FIG. 3, intensified light is transmitted through the camera 318 to the eyepiece of the nightvision system, and then to the user. Note, however, that the intensified light is transmitted to the user through the camera 318, meaning that the intensified light will be affected by characteristics of the camera 318.

Referring once again to FIG. 4, light 426 represents light that is transmitted through transparent portions of the camera 418, while light 432 is blocked by active portions of the camera 418.

However, transmission of light through the camera is nonetheless increased by removing portions of silicon that are not needed for implementing active electrical components or for supporting metal traces. For example, consider an example where dynamic pixel cells are used. In this particular example, there are two sub pixels per pixel. Anode size for the sub pixels is 8 µm×5.1 µm. Pixel area is 10.1 µm×12.4 µm. Pixel pitch is 22.5 µm×22.5 µm. In one example, provides a resolution of 800×800. In this particular camera, if the non-active silicon islands are not removed, transparency of the camera is about 33%. In contrast, transparency is about 61% if the non-active silicon islands are removed such as in the structure illustrated in FIG. 4. Thus, in this example, transparency of a camera is increased by more than 80% by removing silicon and/or oxide trenches.

Note that various engineering trade-offs can be made to meet certain requirements. For example, increased transparency can be obtained by having a lower resolution and/or using fewer sub pixels as there is more space between pixels and/or sub pixels. If a higher resolution is needed, then that camera will have a lower transparency than an equivalently sized camera with a lower resolution. Thus, for example, a camera with a 36 µm pitch can obtain a transparency of 81%, while a camera of 22.5 µm pitch can obtain a transparency of 67%, while a camera having a 17.5 µm pitch will be about 55% transparency when non-active silicon islands are removed from the camera in each of the illustrated examples. Thus, some embodiments may be able to create a camera with at least a 36 µm pitch with at least a transparency of 75%, or a camera of at least a 22.5 µm pitch with at least a transparency of 60%, or a camera having at least a 17.5 µm pitch with at least a 50% transparency when silicon is removed between active silicon areas. The preceding illustrates one specific example related to a particular manufacturing process.

Pitch and transparency values may be specific to a given semiconductor manufacturing process—also known as the technology or process node—and will of course vary as the node changes. Typically designating the process's minimum feature size, the technology node will dictate the area of required active silicon for the display CMOS based on the transistor size. As the node minimum feature size decreases, whether it be through alternate foundries or improvements in technology, the same need for maximizing transparency applies. Indeed, the benefit to removing non-active silicon islands improves as the ratio of inactive- to active-silicon increases with smaller transistors.

The example numbers described herein are derived assuming a 180 nm technology/process node, although similar calculations can be performed for any specific technology size.

Figure 7:
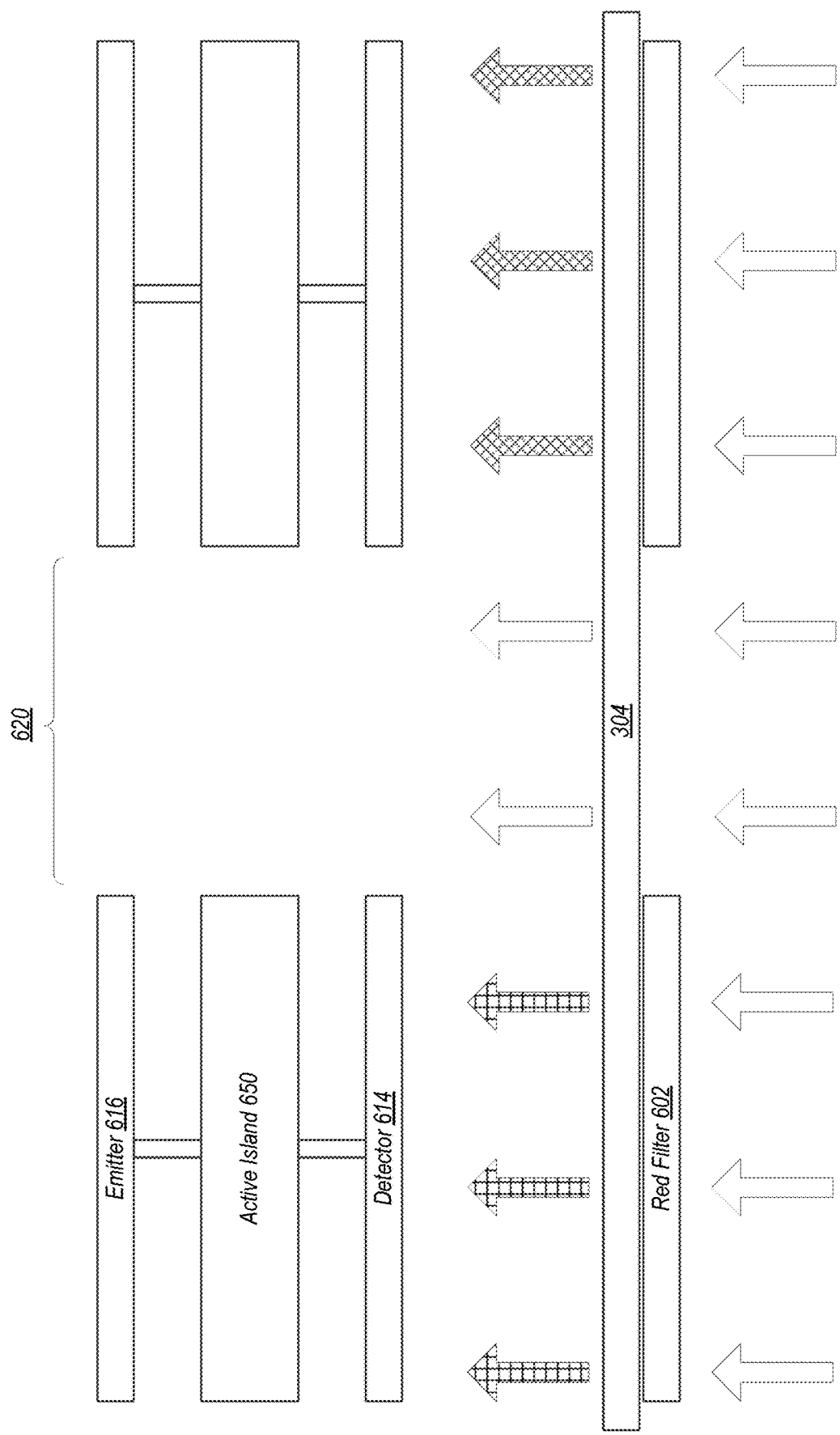
FIG. 7 illustrates an alternative detector and display arrangement.

Referring now to FIG. 7, an alternative arrangement is illustrated. In this example, for one particular filter 602, input light is input into the filter 602. Any unfiltered light will pass to the underlying device 304. Light output from the underlying device will be transmitted to the detector 614. In this example, the detector is under the active island 650 that includes control circuitry for controlling the detector 614 and emitter 616. In this example, the emitter is above the active island 650. In this way, the transparent region 620 can be optimized by stacking the detectors, active islands, and emitters.

While specific examples have been illustrated above, a more general description is now provided. Some embodiments may be implemented as an optical device. For example, embodiments may be implemented as the night vision device 300, although other devices may alternatively or additionally be implemented. The optical device includes an underlying device configured output light in a first spectrum as a result of absorbing input light. In the examples illustrated above, underlying devices, such as underlying device 304 is an example of an underlying device. The visible spectrum is an example of the first spectrum.

The optical device further includes a stacked device, formed in a single semiconductor chip, configured to be coupled in an overlapping fashion to an optical output of the underlying device. The camera 318 illustrated above is an example of such a device. The stacked device is transparent, according to a first transmission efficiency, to light in the first spectrum.

The stacked device includes a plurality of electro-optical circuits formed on the semiconductor chip. The electro-optical circuits include a plurality of light emitters configured to output at least one color of light. For example, the light emitters illustrated in FIG. 5, such as those represented by light emitters 516 and 518 may be examples of light emitters implemented in the electro-optical circuits.

The stacked device further includes a plurality of detectors. The detectors illustrated in FIG. 5 and represented by detector 514 may be examples of such detectors. Each detector is associated with one or more light emitters in the plurality of light emitters. This association may be by being proximate each other, electrically connected to each other, or having controls that are correlated with each other. Each detector is configured to detect light emitted from the underlying device. Thus, in one example, light emitted from the underlying device 304 can be detected by the detectors of FIG. 5. The light emitters are configured to output light dependent on light detected by an associated detector. For example, if light is detected by detector 514, red light will be emitted by emitter 516. In contrast, in one example, if light is detected by the detector corresponding to the filter 506, the green light will be emitted by the emitter 518. Thus, in this example, emitters can be correlated to detectors in different pixels.

The optical device further comprises a plurality of optical filters optically coupled to an optical input of the underlying device. For example, FIG. 3 illustrates a fiber optic faceplate 305 used to optically couple filters (see e.g., the filters in FIG. 5, as represented by filters 502, 506, and 510) to the underlying device 304. Each filter in the plurality of optical filters is in a same optical path, through the underlying device, as a detector from among the plurality of detectors to suppress absorption of certain wavelengths of light by the underlying device thereby affecting light detected by the detectors and thus further affecting the light output by the light emitters. Thus for example, in FIG. 5, filter 502 suppresses wavelengths other than red from being provided to the underlying device 304, thereby causing the underlying device 304 to emit light 504 based on any remaining red wavelengths of the light input into the filter 502. Similarly, filter 506 suppresses wavelengths other than green from being provided to the underlying device 304, thereby causing the underlying device 304 to emit light 508 based on any remaining green wavelengths of the light input into the filter 506. Similarly, filter 510 suppresses wavelengths other than blue from being provided to the underlying device 304, thereby causing the underlying device 304 to emit light 512 based on any remaining blue wavelengths of the light input into the filter 510. The various emitted lights are detected by the detectors. Based on the intensity of emitted light at each detector, a determination can be made as to the color spectrum of input light, and therefore color information can be deduced regarding objects in an environment. The light emitters shown in FIG. 5 can then be appropriate modulated to impart color information to the user.

In some embodiments, the optical device is implemented where the light emitters in the plurality of light emitters comprise red and green light emitters while excluding blue light emitters. An example of this is shown in FIG. 5, where red and green light emitters are included, but no blue light emitters are included. This can be done in some embodiments to limit the number of active elements to create more transparency of the first spectrum in transparent regions. For example, as shown in FIG. 5, the transparent region 520 can be larger if fewer light emitters and associated circuitry are included in the camera 318. Notably, red and green light emitters can be used to create a fairly accurate representation of an environment, particularly when image intensifiers use P45 phosphors that emit blue-white light, which can be used to reconstruct an environment scene when mixed appropriately with red and green lights of various intensities.

Indeed, in some embodiments, the light emitters in the plurality of light emitters may include only a single color of light emitters, while excluding other colors. Indeed, red light emitters have been shown to be particularly suitable for this purpose when used with phosphor screen-based image intensifiers. However, green light emitters might be more useful in foliage rich environments, while blue light emitters might be more useful in water-based environments.

Note that in some embodiments, the optical device may be implemented where the optical filters in the plurality of optical filters comprise a single color of optical filters while excluding other colors. Again, it has been shown that red filters are particularly useful in such applications. Note however, that other colors may be particularly useful for other applications.

The optical device may be implemented where the detectors in the plurality of light emitters correspond, colorwise, to the plurality of optical filters. For example, embodiments may include the same colors for filters as light emitters.

The optical device may be implemented where the detectors in the plurality of detectors are configured as monochrome detectors. In particular, there is no need to detect the color of light at a given detector, rather some embodiments may simply detect whether or not light is detected. Monochrome detectors are often simpler and smaller to implement than full color detectors.

The optical device may be implemented where the detectors in the plurality of detectors are implemented as sub-pixel elements with the light emitters in the plurality of light emitters. Examples of this are shown in FIG. 5. For example, light emitters 516 and 518, and detector 514 are all implemented as sub-pixel elements of the same pixel.

The optical device of claim 1, wherein the filters are arranged according to a varying spatial array. Thus, for example, a non-varying spatial array may have a constant pattern of filters (e.g., rgb, rgb, rgb, . . . ) while a varying spatial array varies the patterns (e.g., rgb, gbr, rbg, rrr, . . . ).

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
   an underlying device configured to output light in a first spectrum as a result of absorbing input light;
   a stacked device, formed in a single semiconductor chip, configured to be coupled in an overlapping fashion to an optical output of the underlying device, the stacked device being transparent, according to a first transmission efficiency, to light in the first spectrum, the stacked device comprising:
   a plurality of electro-optical circuits formed on the semiconductor chip, including:
   a plurality of light emitters, each light emitter in the plurality of light emitters being configured to output at least one color of light;
   a plurality of detectors, each detector associated with one or more light emitters in the plurality of light emitters, each detector configured to detect light emitted from the underlying device; and
   wherein the light emitters in the plurality of light emitters are configured to output light dependent on light detected by an associated detector; and
   the optical device further comprising a plurality of optical filters optically coupled to an optical input of the underlying device, wherein each filter in the plurality of optical filters is aligned with a detector from among the plurality of detectors to suppress absorption of certain wavelengths of light by the underlying device thereby affecting light detected by the detectors and thus further affecting the light output by the light emitters.

2. The optical device of claim 1, wherein the plurality of light emitters comprises red and green light emitters while excluding blue light emitters.

3. The optical device of claim 1, wherein the plurality of light emitters comprises only a single color of light emitters.

4. The optical device of claim 1, wherein the plurality of optical filters comprises only a single color of optical filters.

5. The optical device of claim 1, wherein the detectors in the plurality of detectors correspond, colorwise, to filters in the plurality of optical filters.

6. The optical device of claim 1, wherein the detectors in the plurality of detectors are configured as monochrome detectors.

7. The optical device of claim 1, wherein the detectors in the plurality of detectors are implemented as sub-pixel elements with the light emitters in the plurality of light emitters.

8. The optical device of claim 1, wherein filters in the plurality of filters are arranged according to a varying spatial array.

9. A method of using an optical device, the method comprising:
- at an underlying device, outputting light in a first spectrum as a result of absorbing input light;
- at a stacked device, formed in a single semiconductor chip, coupled in an overlapping fashion to an optical output of the underlying device, the stacked device being transparent, according to a first transmission efficiency, to light in the first spectrum:
- at a plurality of light emitters formed on the semiconductor chip, each of the light emitters in the plurality of light emitters outputting at least one color of light;
- at a plurality of detectors formed on the semiconductor chip, each detector associated with one or more light emitters in the plurality of light emitters, detecting light emitted from the underlying device; and
- wherein the light emitters in the plurality of light emitters output light dependent on light detected by an associated detector; and
- at a plurality of optical filters optically coupled to an optical input of the underlying device, wherein each filter in the plurality of optical filters is aligned with a detector from among the plurality of detectors, suppressing absorption of certain wavelengths of light by the underlying device thereby affecting light detected by the detectors and thus further affecting the light output by the light emitters.

10. The method of claim 9, wherein the plurality of light emitters emits red and green light while excluding emitting blue light.

11. The method of claim 9, wherein the plurality of light emitters emits only a single color.

12. The method of claim 9, wherein the plurality of optical filters filters only for a single color.

13. The method of claim 9, wherein the detectors in the plurality of detectors correspond, colorwise, to filters in the plurality of optical filters.

14. The method of claim 9, wherein the plurality of detectors detects light in monochrome.

15. The method of claim 9, wherein the detectors in the plurality of detectors detect light as sub-pixel elements with the light emitters in the plurality of light emitters.

16. The method of claim 9, wherein filters in the plurality of filters are arranged according to a varying spatial array.

17. A method of manufacturing an optical device, the method comprising:
- optically coupling a stacked device to an underlying device configured to output light in a first spectrum as a result of absorbing input light, the stacked device being formed in a single semiconductor chip, and configured to be coupled in an overlapping fashion to an optical output of the underlying device, the stacked device being transparent, according to a first transmission efficiency, to light in the first spectrum, the stacked device comprising:
- a plurality of electro-optical circuits formed on the semiconductor chip, including:
- a plurality of light emitters, each light emitter in the plurality of light emitters being configured to output at least one color of light;
- a plurality of detectors, each detector associated with one or more light emitters in the plurality of light emitters, each detector configured to detect light emitted from the underlying device; and
- wherein the light emitters in the plurality of light emitters are configured to output light dependent on light detected by an associated detector; and
- optically coupling a plurality of optical filters to an optical input of the underlying device, wherein each filter in the plurality of optical filters is aligned with a detector from among the plurality of detectors to suppress absorption of certain wavelengths of light by the underlying device thereby affecting light detected by the detectors and thus further affecting the light output by the light emitters.

18. The method of claim 17, wherein the plurality of light emitters comprises red and green light emitters while excluding blue light emitters.

19. The method of claim 17, wherein the plurality of light emitters comprises a single color of light emitters.

20. The method of claim 17, wherein the plurality of optical filters comprises a single color of optical filters.

* * * * *